US011515420B2

(12) United States Patent
Crum et al.

(10) Patent No.: US 11,515,420 B2
(45) Date of Patent: Nov. 29, 2022

(54) CONTACTS TO N-TYPE TRANSISTORS WITH X-VALLEY LAYER OVER L-VALLEY CHANNELS

(71) Applicant: Intel Corporation, Santa Clara, CA (US)

(72) Inventors: Dax M. Crum, Beaverton, OR (US); Cory E. Weber, Hillsboro, OR (US); Rishabh Mehandru, Portland, OR (US); Harold Kennel, Portland, OR (US); Benjamin Chu-Kung, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 162 days.

(21) Appl. No.: 16/643,927

(22) PCT Filed: Sep. 29, 2017

(86) PCT No.: PCT/US2017/054585
§ 371 (c)(1),
(2) Date: Mar. 3, 2020

(87) PCT Pub. No.: WO2019/066958
PCT Pub. Date: Apr. 4, 2019

(65) Prior Publication Data
US 2020/0411690 A1 Dec. 31, 2020

(51) Int. Cl.
*H01L 29/78* (2006.01)
*H01L 29/04* (2006.01)
(Continued)

(52) U.S. Cl.
CPC .... *H01L 29/7848* (2013.01); *H01L 21/02532* (2013.01); *H01L 21/02546* (2013.01);
(Continued)

(58) Field of Classification Search
CPC ............... H01L 29/7848; H01L 29/045; H01L 29/0847; H01L 29/165; H01L 29/20;
(Continued)

(56) References Cited

U.S. PATENT DOCUMENTS 8,263,449 B2 9/2012 Hong et al.
9,202,916 B2 * 12/2015 Huang .............. H01L 29/66628
(Continued)

FOREIGN PATENT DOCUMENTS

KR 20110098439 9/2011
KR 20160067640 6/2016
WO 2017111871 6/2017

OTHER PUBLICATIONS

Kiselev, A. A., et al. in "L-valley electrons in SiGe heterostructures: highly anisotropic and tunable Zeeman and Rashba-like spin splittings," AIP Conference Proceedings 772, 411 (2005); https://doi.org/10.1063/1.1994160. Published Online Aug. 2, 2005, pp. 411-412. (Year: 2005).*

(Continued)

*Primary Examiner* — Michael Jung
(74) *Attorney, Agent, or Firm* — Finch & Maloney PLLC

(57) ABSTRACT

An apparatus is provided which comprises: a first region over a substrate, wherein the first region comprises a first semiconductor material having a L-valley transport energy band structure, a second region in contact with the first region at a junction, wherein the second region comprises a second semiconductor material having a X-valley transport energy band structure, wherein a <111> crystal direction of one or more crystals of the first and second semiconductor materials are substantially orthogonal to the junction, and a metal adjacent to the second region, the metal conductively coupled to the first region through the junction. Other embodiments are also disclosed and claimed.

18 Claims, 10 Drawing Sheets

(51) Int. Cl.
*H01L 29/417* (2006.01)
*H01L 29/08* (2006.01)
*H01L 29/165* (2006.01)
*H01L 29/20* (2006.01)
*H01L 29/66* (2006.01)
*H01L 21/02* (2006.01)
*H01L 21/285* (2006.01)
*H01L 29/267* (2006.01)

(52) U.S. Cl.
CPC .. *H01L 21/02609* (2013.01); *H01L 21/28512* (2013.01); *H01L 21/28575* (2013.01); *H01L 29/045* (2013.01); *H01L 29/0847* (2013.01); *H01L 29/165* (2013.01); *H01L 29/20* (2013.01); *H01L 29/267* (2013.01); *H01L 29/41791* (2013.01); *H01L 29/66522* (2013.01); *H01L 29/66795* (2013.01); *H01L 29/785* (2013.01)

(58) Field of Classification Search
CPC ............. H01L 29/267; H01L 29/41791; H01L 29/66522; H01L 29/66795; H01L 29/785
See application file for complete search history.

(56) References Cited

U.S. PATENT DOCUMENTS

| | | |
|---|---|---|
| 2009/0166742 A1 | 7/2009 | Pillarisetty et al. |
| 2013/0285129 A1* | 10/2013 | Jensen ................ H01L 21/324 257/288 |
| 2014/0027860 A1* | 1/2014 | Glass ................ H01L 29/1054 257/401 |
| 2016/0020209 A1* | 1/2016 | Anderson ............ H01L 21/845 257/383 |
| 2016/0079372 A1 | 3/2016 | Kittl et al. |
| 2016/0163704 A1 | 6/2016 | Lee |
| 2016/0204276 A1* | 7/2016 | Dasgupta ............ H01L 29/413 257/76 |
| 2017/0133286 A1* | 5/2017 | Sung ................ H01L 21/823814 |

OTHER PUBLICATIONS

International Search Report and Written Opinion from PCT/US2017/054585 notified Jun. 28, 2018, 11 pgs.
International Preliminary Report on Patentability from PCT/US2017/054585 notified Apr. 9, 2020, 8 pgs.

* cited by examiner

CONTACTS TO N-TYPE TRANSISTORS WITH X-VALLEY LAYER OVER L-VALLEY CHANNELS

CLAIM OF PRIORITY

This Application is a National Stage Entry of, and claims priority to, PCT Application No. PCT/US2017/054585, filed on Sep. 29, 2017 and titled "IMPROVED CONTACTS TO N-TYPE TRANSISTORS WITH L-VALLEY CHANNELS", which is incorporated by reference in its entirety for all purposes.

BACKGROUND

In semiconductor devices, as transistor dimensions scale, the area forming the contact between a metal and the source/drain epitaxial region gets smaller and the contact resistance goes up. Additionally, Schottky barriers make direct connection between certain metal and semiconductor materials unfeasible. Contact resistance, as opposed to the intrinsic resistance of a material, refers to the resistance attributable to electricity flowing over an interface between materials, such as between metal and silicide, or between different semiconductor materials, for example. Contact resistance increases the overall resistance of the transistor conduction path, reducing the drive current which flows in the channel.

The reduction in transistor drive current attributable to contact resistance is one of the main factors limiting increased computer processor performance. Some efforts to minimize contact resistance include the use of specific metals and doped silicides in the source/drain regions. Heavier n-type doping in the source/drain regions leads to lower contact resistance in electron devices. Si can be doped more heavily n-type than most other semiconductors, resulting in lower n-type contact resistance than materials such as, but not limited to, Ge. Si is a so called X-valley material, whereas Ge and is an L-valley material. The high n-type contact resistance of L-valley materials limits their application.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
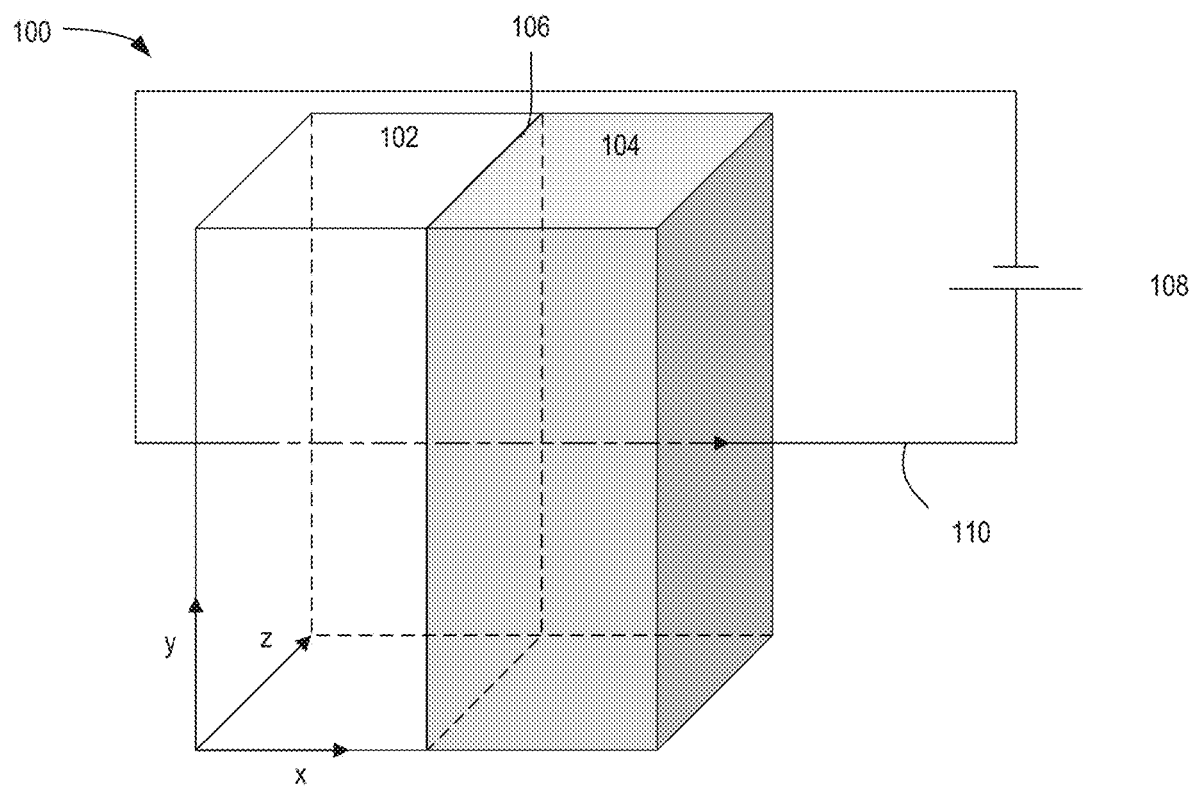
FIG. 1 illustrates an example heterostructure, according to some embodiments.

Improved contacts to n-type transistors with L-valley channels are generally presented. In this regard, embodiments of the present disclosure enable lower contact resistance to L-valley channels through heterostructures with X-valley transport materials adjacent the L-valley channels at particular crystal orientations. Current flows from the metal contacts into the heavily-doped X-valley materials and then into the L-valley channel materials. Resistance across the metal/X-valley material interface is optimized since the X-valley material can be doped heavily n-type. Resistance across the X-valley/L-valley material interface is minimized by engineering the crystal orientation as described in this disclosure. In this regard issues of metal to semiconductor Schottky barriers can be mitigated and heterointerface resistance can be minimized for n-type transistors with L-valley channel materials. One skilled in the art would appreciate that lowering contact resistance through this approach may enable alternative n-type channel materials such as, but not limited to, Ge and $In_yGa_{1-y}As$.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right," "front," "back," "top," "bottom," "over," "under," and the like in the description and in the claims, if any, are used for descriptive purposes and not necessarily for describing permanent relative positions.

FIG. 1 illustrates an example heterostructure, according to some embodiments. As shown, heterostructure 100 includes first material 102, second material 104, heterojunction 106, power source 108, and conduction path 110. In some embodiments, first material 102 and second material 104 are different semiconductor materials. When power source 108, which may represent a battery, voltage regulator, or other power source, is active, electrons may flow around conduction path 110, travel through first material 102, cross over heterojunction 106, and travel through second material 104. As shown in further detail hereinafter, the resistance of electrons to cross over heterojunction 106 may be influenced by, among other factors, the composition and crystal orientations of first material 102 and second material 104.

Figure 2:
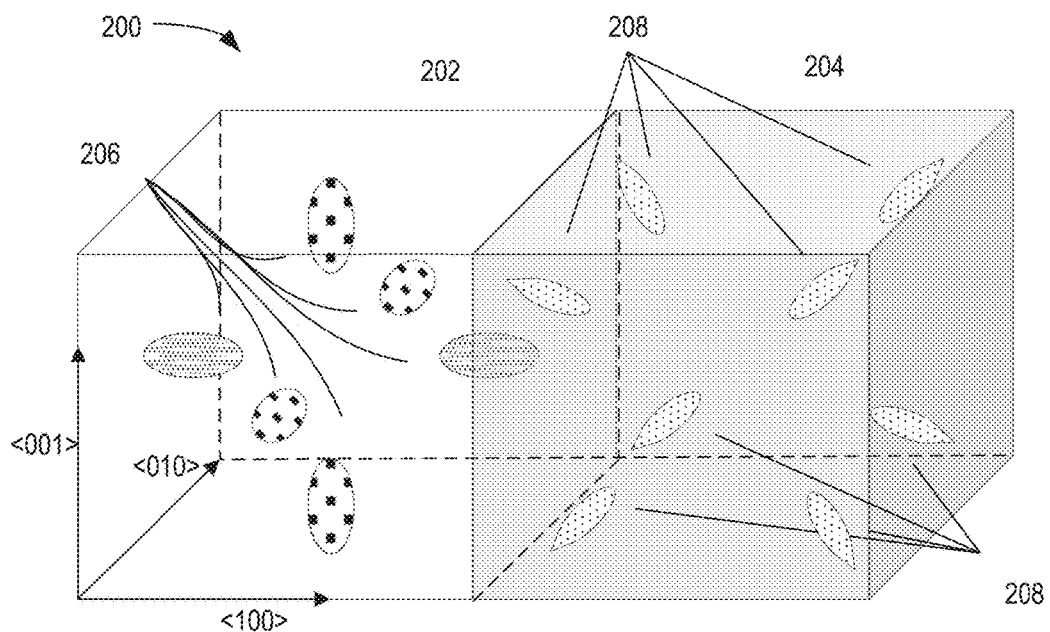
FIG. 2 illustrates an example crystal orientation at a heterojunction, according to some embodiments.

FIG. 2 illustrates an example crystal orientation at a heterojunction, according to some embodiments. As shown, heterojunction 200 includes X-valley crystal 202, L-valley crystal 204, X-valleys 206, and L-valleys 208. X-valley crystal 202 and L-valley crystal 204 may represent crystals of X-valley semiconductor material and L-valley semiconductor material, respectively. As used herein, X-valley semiconductor material refers to semiconductor material with an energy band structure that would suggest that transport is governed by X-valley electrons. One skilled in the art would recognize that examples of X-valley semiconductor material include, but are not limited to, Si and $Si_xGe_{1-x}$, for example. Also, L-valley semiconductor material refers to semiconductor material with an energy band structure that would suggest that transport is governed by L-valley electrons. One skilled in the art would recognize that examples of L-valley semiconductor material include, but are not limited to, Ge and $In_yGa_{1-y}As$, for example.

X-valleys 206 and L-valleys 208 represent theoretical locations where conduction electrons would likely be present in X-valley crystal 202 and L-valley crystal 204, respectively. As shown, X-valley crystal 202 and L-valley crystal 204 are interfacing in a <100> crystal direction, and electrons directed across the interface from X-valley crystal 202 to L-valley crystal 204 would move from an X-valley 206 of X-valley crystal 202 to a L-valley 208 of L-valley crystal 204.

Figure 3:
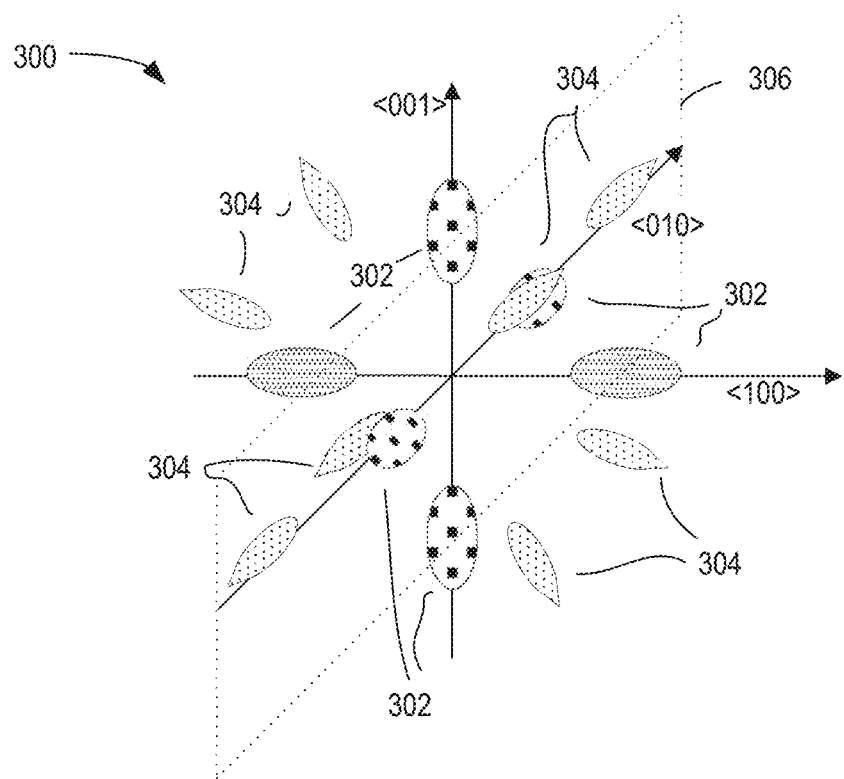
FIG. 3 illustrates an example momentum space at a heterojunction, according to some embodiments.

FIG. 3 illustrates an example momentum space at a heterojunction, according to some embodiments. As shown, map 300 includes X-valleys 302, L-valleys 304, and transverse plane 306. X-valleys 302 lie along principle crystal axes, while L-valleys 304 lie along equivalent <111> crystal directions. Transverse plane 306 is the plane transverse to the direction of electron flow between X-valley and L-valley crystals, which in this case is the <100> crystal direction.

Figure 4:
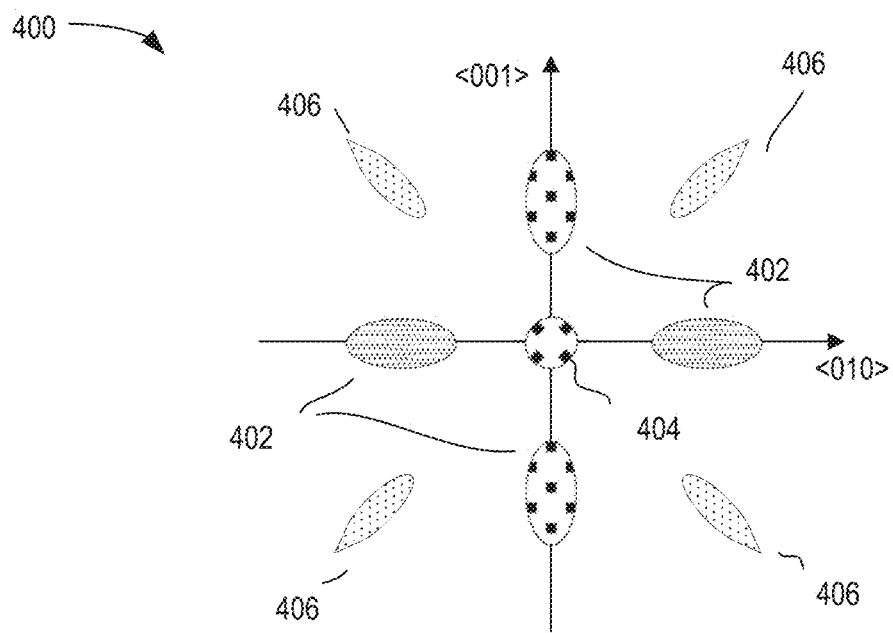
FIG. 4 illustrates an example transverse momentum space at a heterojunction, according to some embodiments.

FIG. 4 illustrates an example transverse momentum space at a heterojunction, according to some embodiments. As shown, map 400 includes X-valleys 402, dual X-valley 404, and dual L-valleys 406. Map 400 represents transverse momentum space (such as transverse plane 306) when electrons are directed across an X-valley crystal/L-valley crystal interface along the <100> crystal direction. As can be seen, X-valleys 402 and dual X-valley 404 do not align with dual L-valleys 406. Thus transverse momentum will not be conserved and significant reflection of electrons and poor conductance would be expected across the interface.

Figure 5:
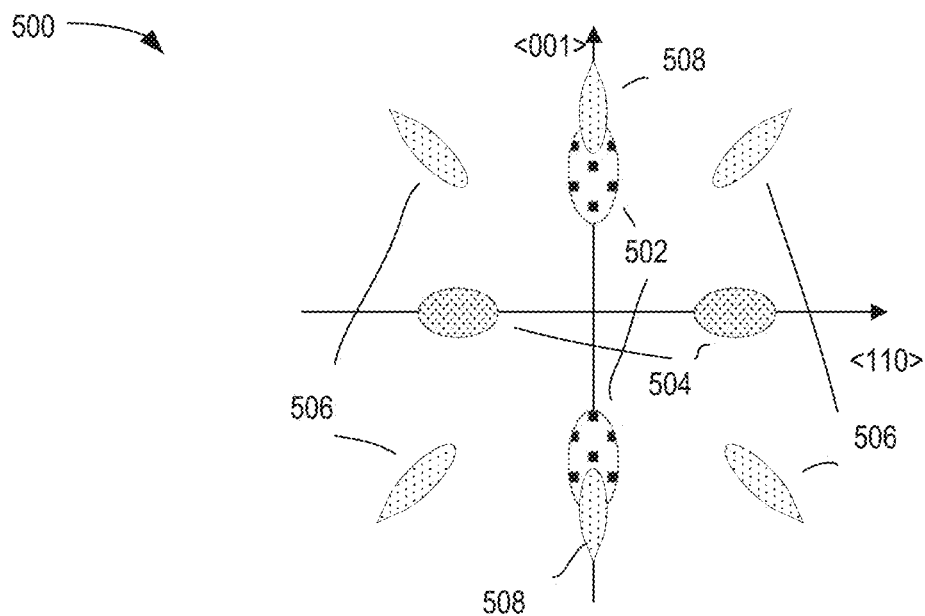
FIG. 5 illustrates an example transverse momentum space at a heterojunction, according to some embodiments.

FIG. 5 illustrates an example transverse momentum space at a heterojunction, according to some embodiments. As shown, map 500 includes X-valleys 502, dual X-valleys 504, L-valleys 506 and dual L-valleys 508. Map 500 represents transverse momentum space when electrons are directed across an X-valley crystal/L-valley crystal interface along the <110> crystal direction. As can be seen X-valleys 502 and dual X-valleys 504 are non-overlapping with L-valleys 506 and dual L-valleys 508. Thus transverse momentum will not be conserved and significant reflection of electrons and poor conductance would be expected across the interface.

Figure 6:
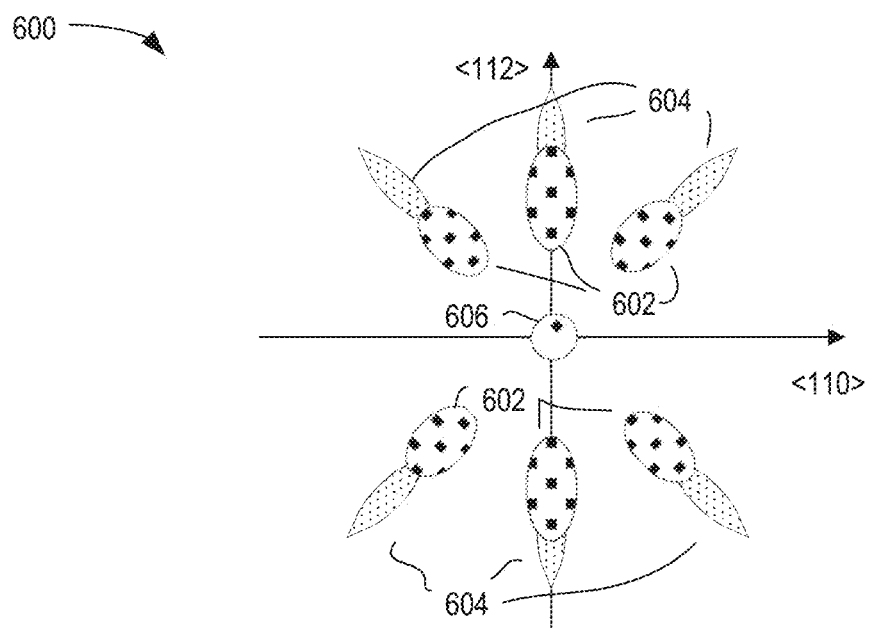
FIG. 6 illustrates an example transverse momentum space at a heterojunction, according to some embodiments.

FIG. 6 illustrates an example transverse momentum space at a heterojunction, according to some embodiments. As shown, map 600 includes X-valleys 602, L-valleys 604 and dual L-valley 606. Map 600 represents transverse momentum space when electrons are directed across an X-valley crystal/L-valley crystal interface along the <111> crystal direction. As can be seen, X-valleys 602 are aligned with L-valleys 604, and enhanced transmission would be expected across the interface as a result of conserving transverse momentum. This crystal alignment would tend to increase conductance and lower contact resistance.

Figure 7:
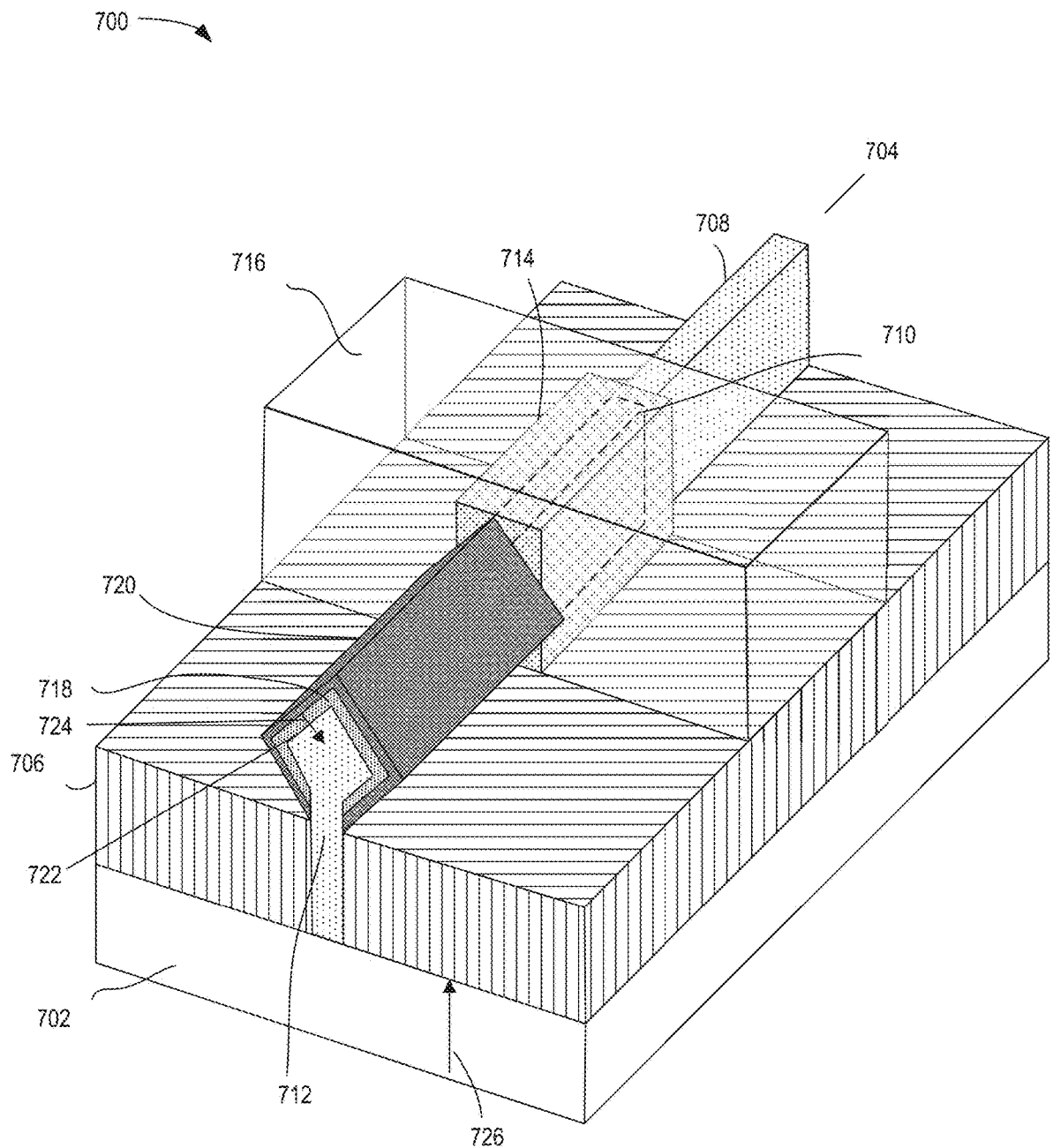
FIG. 7 illustrates a perspective view of an example semiconductor device with improved contacts to n-type transistors with L-valley channels, according to some embodiments.

FIG. 7 illustrates a perspective view of an example semiconductor device with an enhanced metal contact area, according to some embodiments. As shown, device 700 includes substrate 702, fin 704, insulator 706, drain region 708, channel region 710, source region 712, gate dielectric 714, gate region 716, nucleation layer 718, contact metal 720, heterojunction 722, electron flow direction 724, and crystal direction 726. While shown as being a FinFET transistor, in other embodiments, device 700 may be a different topology, such as a planar transistor, or different device, such as a diode. While shown as including a single fin 704 and gate region 716, in some embodiments, device 700 may include multiple fins 704 and/or gate regions 716.

In some embodiments, substrate 702 comprises at least one layer of undoped semiconductor, such as Ge, Si, SiGe, InGaAs, AlSb, etc., which may form fin 704. In some embodiments, fin 704, which may include drain region 708, semiconductor region 710, and source region 712, may be formed separately from substrate 702 and may contain different semiconductor materials. Substrate 702 may be composed of one or more semiconductor material layers on top of another semiconductor material such as silicon. In some embodiments, insulator 706 is composed of a buried oxide layer that is adjacent to fin 704. When device 700 is in an active mode, channel region 710 may serve as a conduction path between source region 712 and drain region 708, located on opposite sides of channel region 710. In some embodiments, device 700 may be an NMOS transistor and source region 712 and drain region 708 are n-doped variants of the same semiconductor as semiconductor region 710, for example germanium. While only source region 712 is shown as having a diamond shape, with a peak and slanted surfaces, in some embodiments drain region 708 has a same shape as source region 712. In some embodiments, fin 704 comprises Ge or $In_yGa_{1-y}As$, where y<0.3. In some embodiments, source region 712 (and drain region 708) may be formed by an epitaxial growth selective to forming a <111> crystal direction facet. In some embodiments, source region 712 (and drain region 708) may be overgrown and a stop etch selective to forming a <111> crystal direction facet may be utilized.

Nucleation layer 718 may represent a substantially conformal thin film epitaxially formed on a surface of source region 712, forming heterojunction 722. In some embodiments, nucleation layer 718 may comprise $Si_xGe_{1-x}$. In some embodiments, nucleation layer 718 may comprise graded $Si_xGe_{1-x}$ where x varies from nearly 1 at contact metal 720 to nearly 0 at heterojunction 722. In some embodiments, nucleation layer 718 may include dopants, such as phosphorus or arsenic or similar molecules, for improved contact properties. While shown as being present in source region 712, nucleation layer 718 may also cover a surface of drain region 708. Contact metal 720 may contact nucleation layer 718. In some embodiments, contact metal 720 may comprise titanium, cobalt or other metals.

Gate region 716, along with gate dielectric 714, may form a gate stack on channel region 710. Gate region 716 may be a metal coupled with interconnects, not shown, to provide a voltage proximate to channel region 710 to place device 700 into an active mode. In some embodiments, gate dielectric 714 may include oxides and/or nitrides.

In some embodiments, substrate 702 has cubic crystallinity and crystal direction 726 is a <100> crystal direction. In some embodiments, substrate 702 is a portion of a (100) wafer. In some embodiments, heterojunction 722 is substantially 45 degrees (within about ten degrees) to a (100) plane of substrate 702. One skilled in the art would appreciate that electron flow direction 724, which is substantially orthogonal (within about ten degrees) to heterojunction 722 would correspond with a <111> crystal direction in nucleation layer 718 and source region 712.

Figure 8:
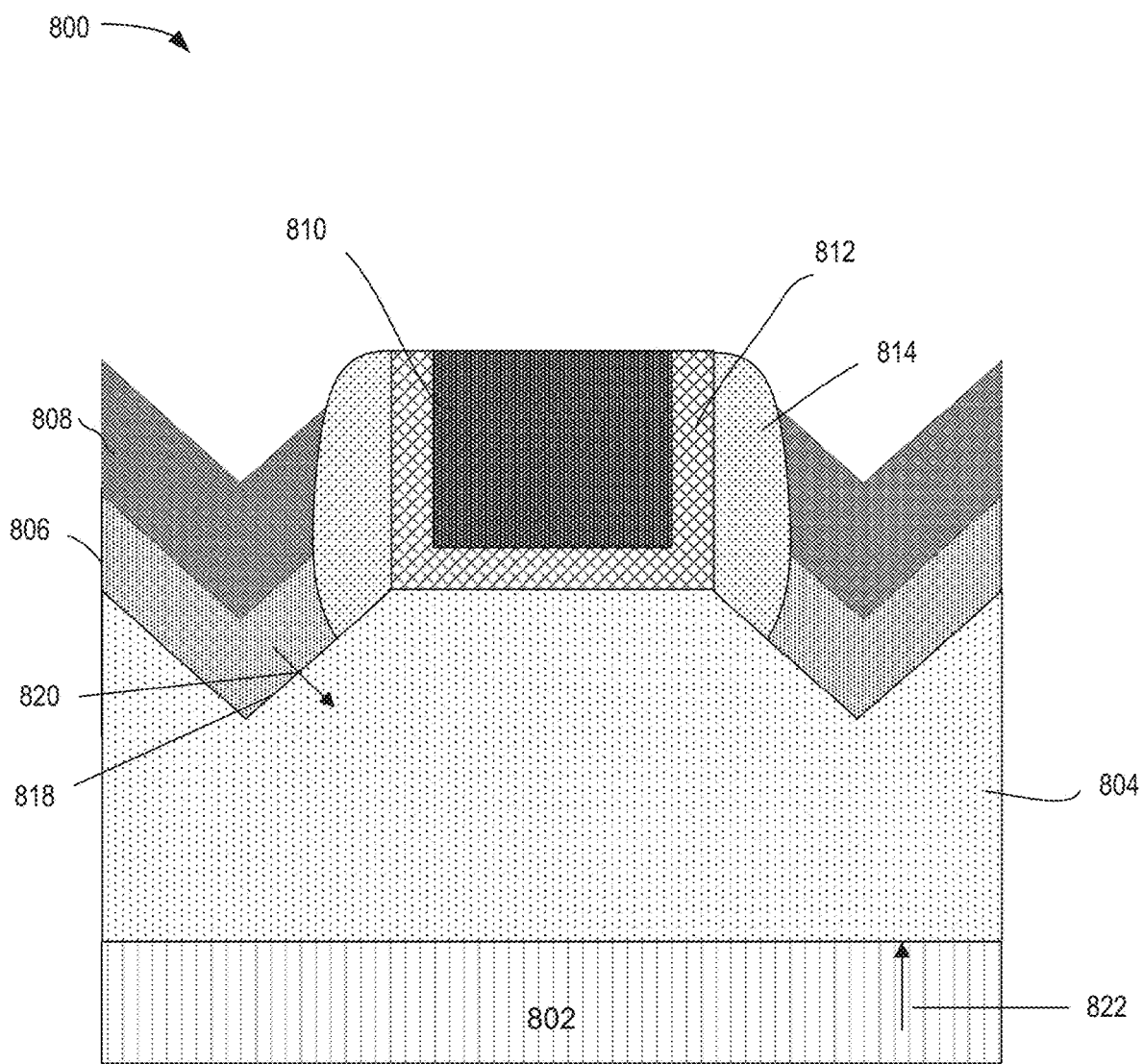
FIG. 8 illustrates a cross-sectional view of an example semiconductor device with improved contacts to n-type transistors with L-valley channels, according to some embodiments.

FIG. 8 illustrates a cross-sectional view of an example semiconductor device with improved contacts to n-type transistors with L-valley channels, according to some embodiments. As shown, device 800 includes substrate 802, channel region 804, source region 806, metal contact 808, gate region 810, gate dielectric 812, spacer 814, heterojunction 818, electron flow direction 820, and crystal direction 822. In some embodiments, device 800 represents a cross-section of a planar transistor, however in other embodiments different semiconductor devices may be used. For example, in some embodiments device 800 may be a tri-gate FinFET. Also, device 800 may include additional layers not shown.

In some embodiments, channel region 804 comprises Ge or $In_yGa_{1-y}As$, where y<0.3. In some embodiments, source region 806 may be formed by an epitaxial growth after a stop etch selective to forming a <111> crystal direction facet in channel region 804 has been utilized, forming heterojunction 818. In some embodiments, source region 806 may comprise $Si_xGe_{1-x}$. In some embodiments, source region 806 may comprise graded $Si_xGe_{1-x}$ where x varies from nearly 1 at contact metal 808 to nearly 0 at heterojunction 818.

Gate region 810, along with gate dielectric 812, may form a gate stack on channel region 804. Gate region 810 may be a metal coupled with interconnects, not shown, to provide a voltage proximate to channel region 804 to place device 800 into an active mode. In some embodiments, gate dielectric 812 may include oxides and/or nitrides. Spacer 814 may provide further insulation between gate region 810 and source/drain regions.

In some embodiments, substrate 802 has cubic crystallinity and crystal direction 822 is a <100> crystal direction. In some embodiments, substrate 802 is a portion of a (100) wafer. In some embodiments, heterojunction 818 is substantially 45 degrees (within about ten degrees) to a (100) plane of substrate 802. One skilled in the art would appreciate that electron flow direction 820, which is substantially orthogonal (within about ten degrees) to heterojunction 818 would correspond with a <111> crystal direction in source region 806 and channel region 804.

Figure 9:
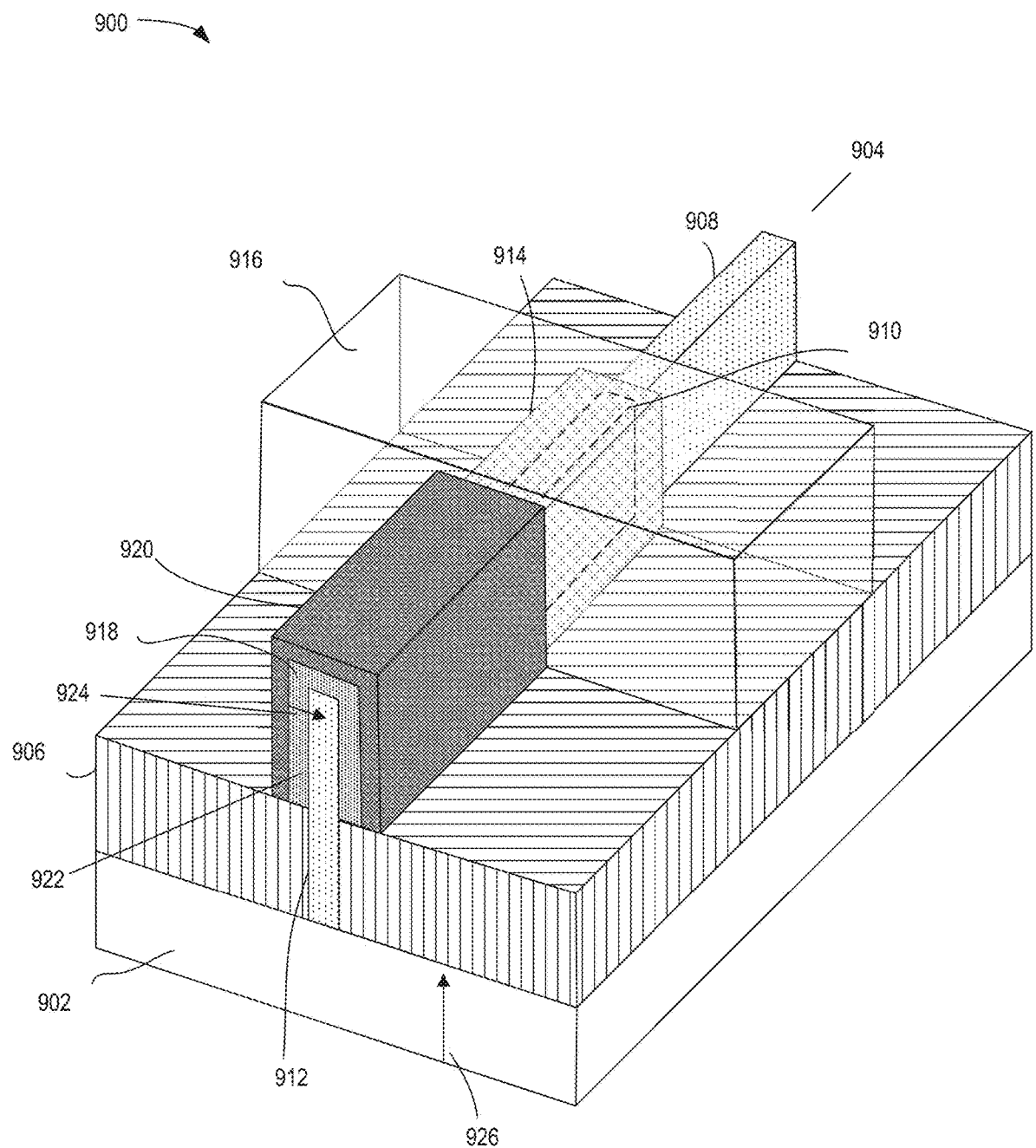
FIG. 9 illustrates a perspective view of an example semiconductor device with improved contacts to n-type transistors with L-valley channels, according to some embodiments.

FIG. 9 illustrates a perspective view of an example semiconductor device with an enhanced metal contact area, according to some embodiments. As shown, device 900 includes substrate 902, fin 904, insulator 906, drain region 908, channel region 910, source region 912, gate dielectric 914, gate region 916, nucleation layer 918, contact metal 920, heterojunction 922, electron flow direction 924, and crystal direction 926. While shown as being a FinFET transistor, in other embodiments, device 900 may be a different topology, such as a planar transistor, or different device, such as a diode. While shown as including a single fin 904 and gate region 916, in some embodiments, device 900 may include multiple fins 904 and/or gate regions 916.

In some embodiments, substrate 902 comprises at least one layer of undoped semiconductor, such as Ge, Si, SiGe, InGaAs, AlSb, etc., which may form fin 904. In some embodiments, fin 904, which may include drain region 908, channel region 910, and source region 912, may be formed separately from substrate 902 and may contain different semiconductor materials. Substrate 902 may be composed of one or more semiconductor material layers on top of another semiconductor material such as silicon. In some embodiments, insulator 906 is composed of a buried oxide layer that is adjacent to fin 904. When device 900 is in an active mode, channel region 910 may serve as a channel between source region 912 and drain region 908, located on opposite sides of channel region 910. In some embodiments, device 900 may be an NMOS transistor and source region 912 and drain region 908 are n-doped variants of the same semiconductor as channel region 910, for example germanium. In some embodiments, fin 904 comprises Ge or $In_yGa_{1-y}As$, where y<0.3.

Nucleation layer 918 may represent a substantially conformal thin film epitaxially formed on a surface of source region 912, forming heterojunction 922. In some embodiments, nucleation layer 918 may comprise $Si_xGe_{1-x}$. In some embodiments, nucleation layer 918 may comprise graded $Si_xGe_{1-x}$ where x varies from nearly 1 at contact metal 920 to nearly 0 at heterojunction 922. In some embodiments, nucleation layer 918 may include dopants, such as phosphorus or arsenic or similar molecules, for improved contact properties. While shown as being present in source region 912, nucleation layer 918 may also cover a surface of drain region 908. Contact metal 920 may contact nucleation layer 918. In some embodiments, contact metal 920 may comprise titanium, cobalt or other metals.

Gate region 916, along with gate dielectric 914, may form a gate stack on channel region 910. Gate region 916 may be a metal coupled with interconnects, not shown, to provide a voltage proximate to channel region 910 to place device 900 into an active mode. In some embodiments, gate dielectric 914 may include oxides and/or nitrides.

In some embodiments, substrate 902 has cubic crystallinity and crystal direction 926 is a <110> crystal direction. In some embodiments, substrate 902 is a portion of a (110) wafer. In some embodiments, heterojunction 922 is substantially orthogonal (within about ten degrees) to a (110) plane of substrate 902. One skilled in the art would appreciate that electron flow direction 924, which is substantially orthogonal (within about ten degrees) to heterojunction 922 would correspond with a <111> crystal direction in nucleation layer 918 and source region 912.

Figure 10:
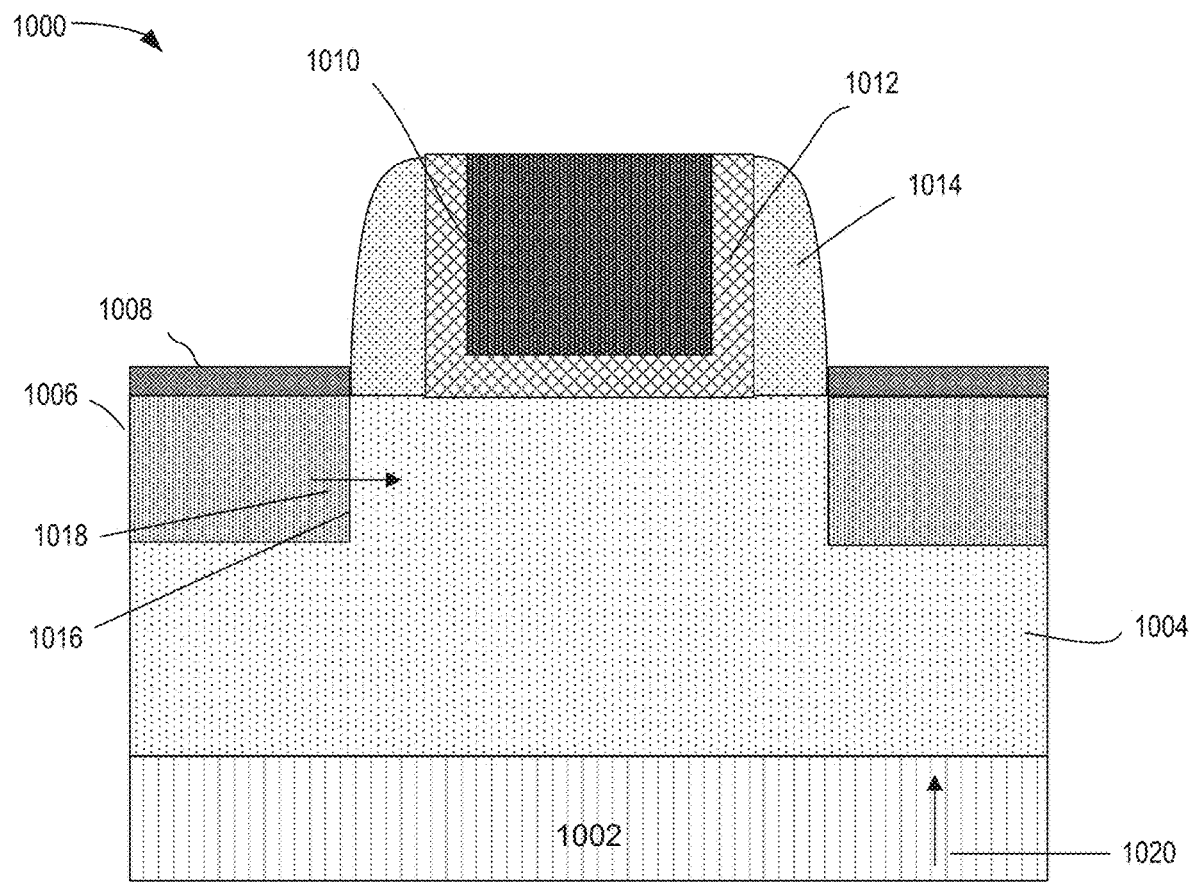
FIG. 10 illustrates a cross-sectional view of an example semiconductor device with improved contacts to n-type transistors with L-valley channels, according to some embodiments.
Figure 11:
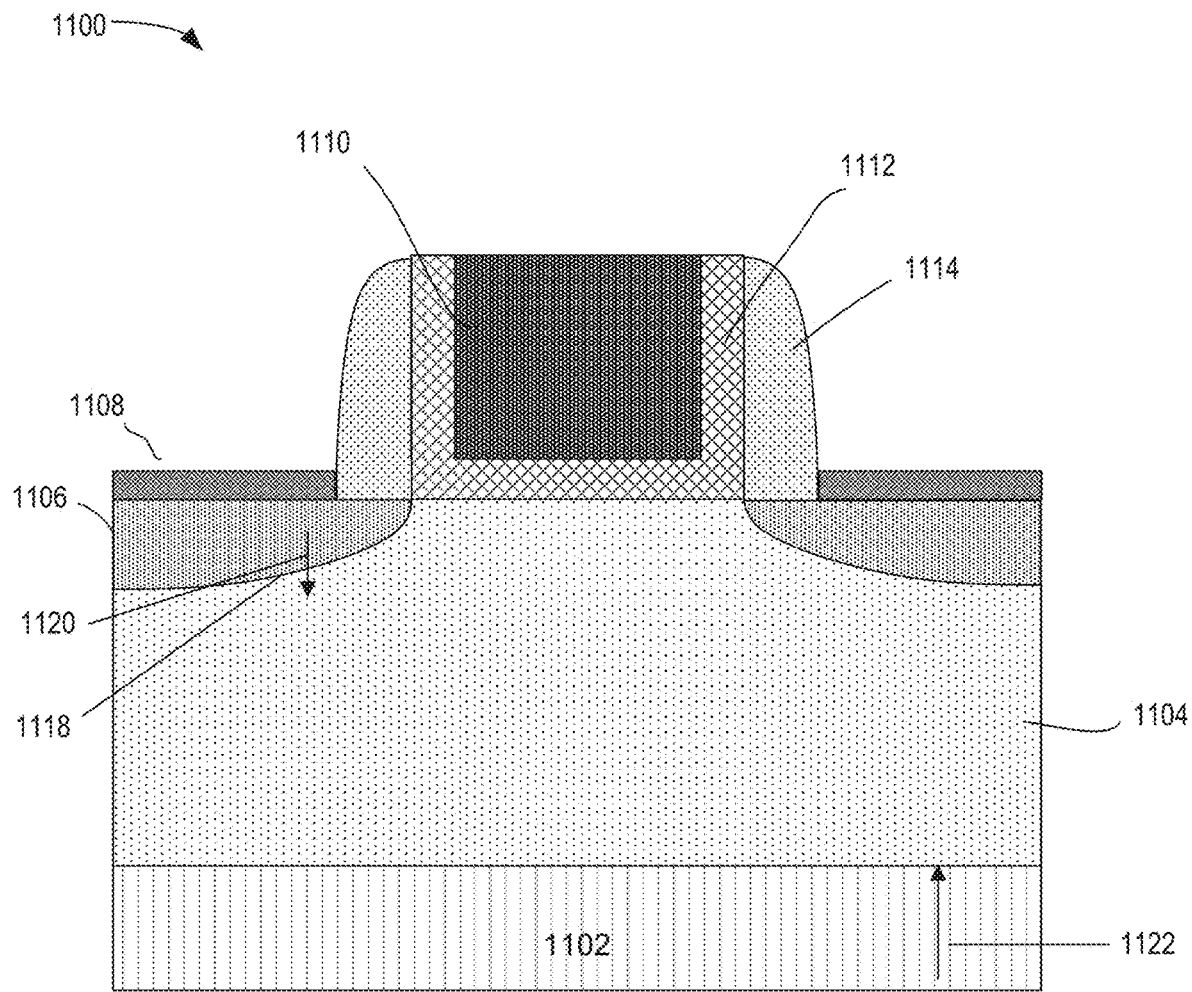
FIG. 11 illustrates a cross-sectional view of an example semiconductor device with improved contacts to n-type transistors with L-valley channels, according to some embodiments.

FIG. 10 illustrates a cross-sectional view of an example semiconductor device with improved contacts to n-type transistors with L-valley channels, according to some embodiments. As shown, device 1000 includes substrate 1002, channel region 1004, source region 1006, metal contact 1008, gate region 1010, gate dielectric 1012, spacer 1014, heterojunction 1016, electron flow direction 1018, and crystal direction 1020. In some embodiments, device 1000 represents a cross-section of a planar transistor, however in other embodiments different semiconductor devices may be used. For example, in some embodiments device 1000 may be a tri-gate FinFET. Also, device 1000 may include additional layers not shown.

In some embodiments, channel region 1004 comprises Ge or $In_yGa_{1-y}As$, where y<0.3. In some embodiments, source region 1006 may be formed by an epitaxial growth after a stop etch selective to forming a <111> crystal direction facet in channel region 1004 has been utilized, forming heterojunction 1016. In some embodiments, source region 1006 may comprise $Si_xGe_{1-x}$. In some embodiments, source region 1006 may comprise graded $Si_xGe_{1-x}$ where x varies from nearly 1 at contact metal 1008 to nearly 0 at heterojunction 1016.

Gate region 1010, along with gate dielectric 1012, may form a gate stack on channel region 1004. Gate region 1010 may be a metal coupled with interconnects, not shown, to provide a voltage proximate to channel region 1004 to place device 1000 into an active mode. In some embodiments, gate dielectric 1012 may include oxides and/or nitrides. Spacer 1014 may provide further insulation between gate region 1010 and source/drain regions.

In some embodiments, substrate 1002 has cubic crystallinity and crystal direction 1020 is a <110> crystal direction. In some embodiments, substrate 1002 is a portion of a (110) wafer. In some embodiments, heterojunction 1016 is substantially orthogonal (within about ten degrees) to a (110) plane of substrate 1002. One skilled in the art would appreciate that electron flow direction 1018, which is substantially orthogonal (within about ten degrees) to heterojunction 1016 would correspond with a <111> crystal direction in source region 1006 and channel region 1004.

FIG. 1 illustrates a cross-sectional view of an example semiconductor device with improved contacts to n-type transistors with L-valley channels, according to some embodiments. As shown, device 1100 includes substrate 1102, channel region 1104, source region 1106, contact metal 1108, gate region 1110, gate dielectric 1112, spacer 1114, heterojunction 1118, electron flow direction 1120, and crystal direction 1122. In some embodiments, device 1100 represents a cross-section of a planar transistor, however in other embodiments different semiconductor devices may be used. For example, in some embodiments device 1100 may be a tri-gate FinFET. Also, device 1100 may include additional layers not shown.

In some embodiments, channel region 1104 comprises Ge or $In_yGa_{1-y}As$, where y<0.3. In some embodiments, source region 1106 may be formed by an epitaxial growth after a source/drain replacement in channel region 1104 has been utilized, forming heterojunction 1118. In some embodiments, source region 1106 may comprise $Si_xGe_{1-x}$. In some embodiments, source region 1106 may comprise graded $Si_xGe_{1-x}$ where x varies from nearly 1 at contact metal 1108 to nearly 0 at heterojunction 1118.

Gate region 1110, along with gate dielectric 1112, may form a gate stack on channel region 1104. Gate region 1110 may be a metal coupled with interconnects, not shown, to provide a voltage proximate to channel region 1104 to place device 1100 into an active mode. In some embodiments, gate dielectric 1112 may include oxides and/or nitrides. Spacer 1114 may provide further insulation between gate region 1110 and source/drain regions.

In some embodiments, substrate 1102 has cubic crystallinity and crystal direction 1122 is a <111> crystal direction. In some embodiments, substrate 102 is a portion of a (111) wafer. In some embodiments, heterojunction 1118 is substantially parallel (within about ten degrees) to a (111) plane of substrate 1102. One skilled in the art would appreciate that electron flow direction 1120, which is substantially orthogonal (within about ten degrees) to heterojunction 1118 would correspond with a <111> crystal direction in source region 1106 and channel region 1104.

Figure 12:
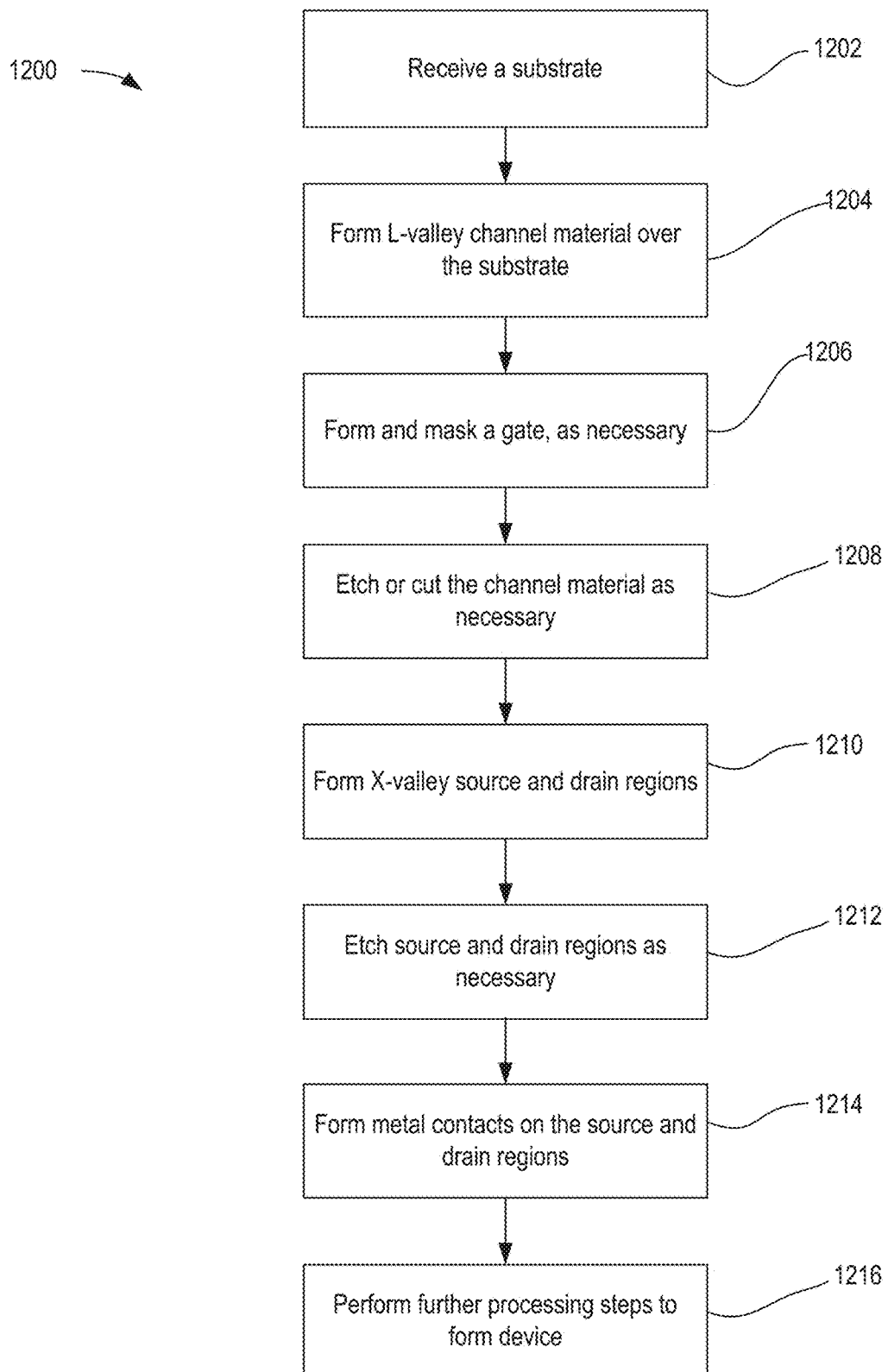
FIG. 12 illustrates a flowchart of a method of forming a semiconductor device with improved contacts to n-type transistors with L-valley channels, in accordance with some embodiments.

FIG. 12 illustrates a flowchart of a method of forming a semiconductor device with improved contacts to n-type transistors with L-valley channels, in accordance with some embodiments. Although the blocks in the flowchart with reference to FIG. 12 are shown in a particular order, the order of the actions can be modified. Thus, the illustrated embodiments can be performed in a different order, and some actions/blocks may be performed in parallel. Some of the blocks and/or operations listed in FIG. 12 are optional in accordance with certain embodiments. The numbering of the blocks presented is for the sake of clarity and is not intended to prescribe an order of operations in which the various blocks must occur. Additionally, operations from the various flows may be utilized in a variety of combinations.

Method 1200 begins with receiving (1202) a substrate. In some embodiments, the substrate may be a portion of a (100) wafer, for example substrates 702 and 802, a (110) wafer, for example substrates 902 and 1002, or a (111) wafer, for example substrate 1102. Next, L-valley channel material is formed (1204) over the substrate. In some embodiments, channel materials may comprise Ge or $In_yGa_{1-y}As$, where y<0.3.

Then, a gate stack is formed (1206) on a channel material. In some embodiments, a dummy gate is initially formed and then replaced with a metal gate in a later step. In some embodiments a metal gate may be formed and then temporarily covered with a mask material. Next, the channel material may be etched or cut (1208) as necessary to form facets. In some embodiments, facets may be formed in the channel material with a wet stop etch selective for a <111> crystal direction interface.

The method continues with forming (1210) X-valley source and drain regions. In some embodiments, X-valley material may comprise $Si_xGe_{1-x}$. In some embodiments, the X-valley material may comprise graded $Si_xGe_{1-x}$ where x varies from nearly 1 at a contact metal to nearly 0 at an L-valley heterojunction. Next, source and drain regions may be etched (1212) as necessary. In some embodiments, source and drain regions may be etched back or undercut to expose a facet.

Then metal contacts may be formed (1214) on the source and drain regions. In some embodiments, contact metal, which may be titanium, cobalt, or another metal, is formed over source and drain regions. Finally, further processing steps may be performed (1216) to form a device. In some embodiments, a gate replacement may be performed followed by formation of multiple interconnect layers.

Figure 13:
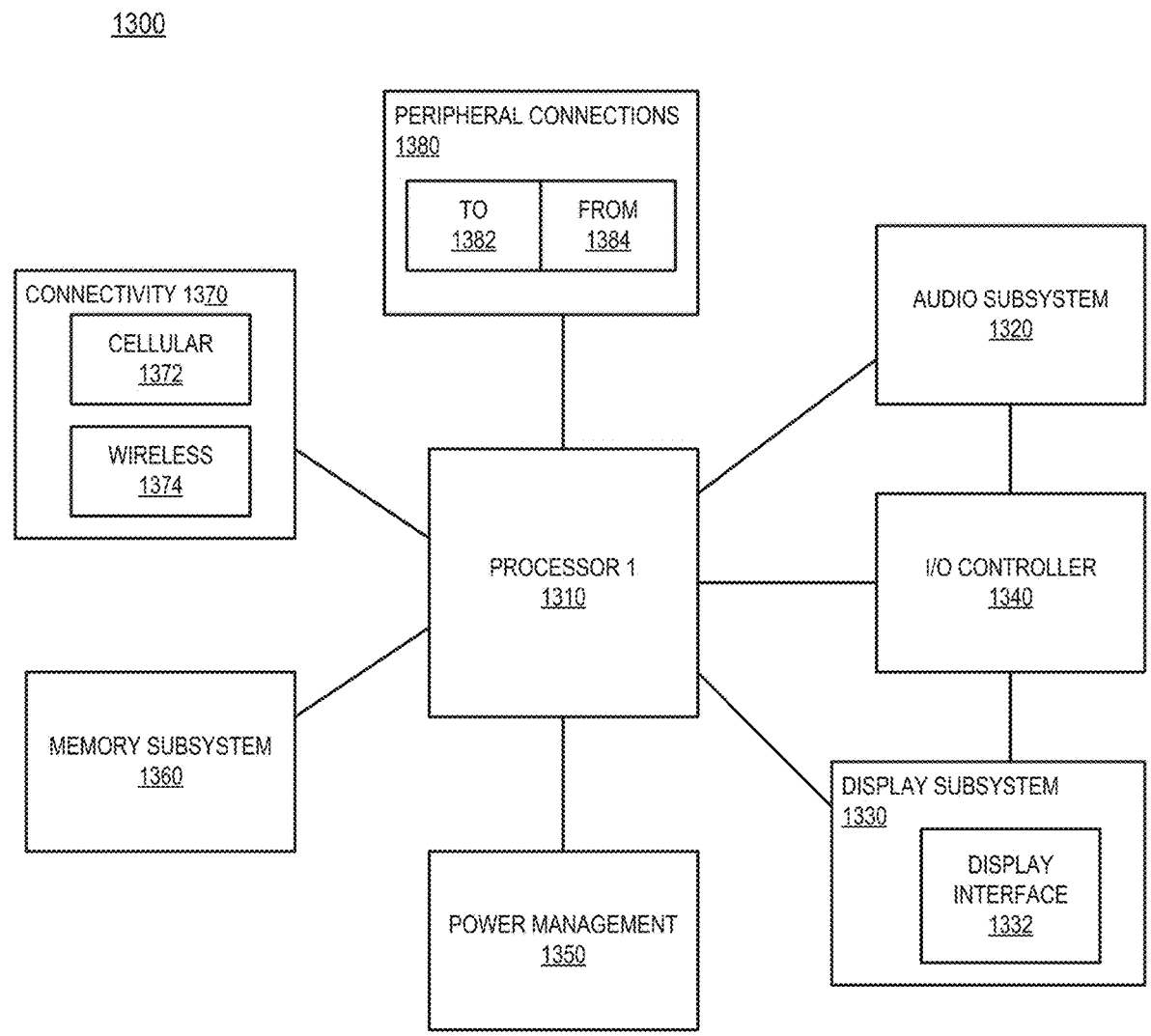
FIG. 13 illustrates a smart device or a computer system or a SoC (System-on-Chip) which includes a semiconductor device with improved contacts to n-type transistors with L-valley channels, according to some embodiments.

FIG. 13 illustrates a smart device or a computer system or a SoC (System-on-Chip) 1300 which includes a semiconductor device with improved contacts to n-type transistors with L-valley channels, according to some embodiments. In some embodiments, computing device 1300 represents a mobile computing device, such as a computing tablet, a mobile phone or smart-phone, a wireless-enabled e-reader, or other wireless mobile device. It will be understood that certain components are shown generally, and not all components of such a device are shown in computing device 1300. In some embodiments, one or more components of computing device 1300, for example processor 1310 and/or memory subsystem 1360, include a semiconductor device with X-valley/L-valley semiconductor heterojunctions as described above.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Tunneling FET (TFET), Square or Rounded Wire Transistors, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, etc., may be used without departing from the scope of the disclosure.

In some embodiments, computing device 1300 includes a first processor 1310. The various embodiments of the present disclosure may also comprise a network interface within 1370 such as a wireless interface so that a system embodiment may be incorporated into a wireless device, for example, cell phone or personal digital assistant.

In one embodiment, processor 1310 can include one or more physical devices, such as microprocessors, application processors, microcontrollers, programmable logic devices, or other processing means. The processing operations performed by processor 1310 include the execution of an operating platform or operating system on which applications and/or device functions are executed. The processing operations include operations related to I/O (input/output) with a human user or with other devices, operations related to power management, and/or operations related to connecting the computing device 1300 to another device. The processing operations may also include operations related to audio I/O and/or display I/O.

In one embodiment, computing device 1300 includes audio subsystem 1320, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1300, or connected to the computing device 1300. In one embodiment, a user interacts with the computing device 1300 by providing audio commands that are received and processed by processor 1310.

Display subsystem 1330 represents hardware (e.g., display devices) and software (e.g., drivers) components that provide a visual and/or tactile display for a user to interact with the computing device 1300. Display subsystem 1330 includes display interface 1332, which includes the particular screen or hardware device used to provide a display to a user. In one embodiment, display interface 1332 includes logic separate from processor 1310 to perform at least some processing related to the display. In one embodiment, display subsystem 1330 includes a touch screen (or touch pad) device that provides both output and input to a user.

I/O controller 1340 represents hardware devices and software components related to interaction with a user. I/O controller 1340 is operable to manage hardware that is part of audio subsystem 1320 and/or display subsystem 1330. Additionally, I/O controller 1340 illustrates a connection point for additional devices that connect to computing device 1300 through which a user might interact with the system. For example, devices that can be attached to the computing device 1300 might include microphone devices, speaker or stereo systems, video systems or other display devices, keyboard or keypad devices, or other I/O devices for use with specific applications such as card readers or other devices.

As mentioned above, I/O controller 1340 can interact with audio subsystem 1320 and/or display subsystem 1330. For example, input through a microphone or other audio device can provide input or commands for one or more applications or functions of the computing device 1300. Additionally, audio output can be provided instead of, or in addition to display output. In another example, if display subsystem 1330 includes a touch screen, the display device also acts as an input device, which can be at least partially managed by I/O controller 1340. There can also be additional buttons or switches on the computing device 1300 to provide I/O functions managed by I/O controller 1340.

In one embodiment, I/O controller 1340 manages devices such as accelerometers, cameras, light sensors or other environmental sensors, or other hardware that can be included in the computing device 1300. The input can be part of direct user interaction, as well as providing environmental input to the system to influence its operations (such as filtering for noise, adjusting displays for brightness detection, applying a flash for a camera, or other features).

In one embodiment, computing device 1300 includes power management 1350 that manages battery power usage, charging of the battery, and features related to power saving operation. Memory subsystem 1360 includes memory devices for storing information in computing device 1300. Memory can include nonvolatile (state does not change if power to the memory device is interrupted) and/or volatile (state is indeterminate if power to the memory device is interrupted) memory devices. Memory subsystem 1360 can store application data, user data, music, photos, documents, or other data, as well as system data (whether long-term or temporary) related to the execution of the applications and functions of the computing device 1300.

Elements of embodiments are also provided as a machine-readable medium (e.g., memory 1360) for storing the computer-executable instructions. The machine-readable medium (e.g., memory 1360) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1370 includes hardware devices (e.g., wireless and/or wired connectors and communication hardware) and software components (e.g., drivers, protocol stacks) to enable the computing device 1300 to communicate with external devices. The computing device 1300 could be separate devices, such as other computing devices, wireless access points or base stations, as well as peripherals such as headsets, printers, or other devices.

Connectivity 1370 can include multiple different types of connectivity. To generalize, the computing device 1300 is illustrated with cellular connectivity 1372 and wireless connectivity 1374. Cellular connectivity 1372 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1374 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1380 include hardware interfaces and connectors, as well as software components (e.g., drivers, protocol stacks) to make peripheral connections. It will be understood that the computing device 1300 could both be a peripheral device ("to" 1382) to other computing devices, as well as have peripheral devices ("from" 1384) connected to it. The computing device 1300 commonly has a "docking" connector to connect to other computing devices for purposes such as managing (e.g., downloading and/or uploading, changing, synchronizing) content on computing device 1300. Additionally, a docking connector can allow computing device 1300 to connect to certain peripherals that allow the computing device 1300 to control content output, for example, to audiovisual or other systems.

In addition to a proprietary docking connector or other proprietary connection hardware, the computing device 1300 can make peripheral connections 1380 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

In one example, an apparatus is provided comprising: a first region over a substrate, wherein the first region comprises a first semiconductor material having a L-valley transport energy band structure; a second region in contact with the first region at a junction, wherein the second region comprises a second semiconductor material having a X-valley transport energy band structure, wherein a <111> crystal direction of one or more crystals of the first and second semiconductor materials are substantially orthogonal to the junction; and a metal adjacent to the second region, the metal conductively coupled to the first region through the junction.

In some embodiments, the substrate has cubic crystallinity and wherein the junction is substantially 45 degrees to a surface of the first region nearest a (100) plane of the substrate. In some embodiments, the substrate has cubic crystallinity and wherein the junction is substantially orthogonal to a surface of the first region nearest a (110) plane of the substrate. In some embodiments, the substrate has cubic crystallinity and wherein the junction is substantially parallel to a surface of the first region nearest a (111) plane of the substrate. In some embodiments, the junction comprises a facet of the first semiconductor material. In some embodiments, the first semiconductor material comprises germanium or indium gallium arsenide. In some embodiments, the second semiconductor material comprises silicon or silicon germanium. In some embodiments, the second semiconductor material comprises silicon germanium with a graded concentration of germanium, the graded concentration comprising a greater than 50% concentration of germanium adjacent the junction.

In another example, an NMOS device is provided comprising: a channel region over a substrate, wherein the channel region comprises a first semiconductor material having a L-valley transport energy band structure; a gate stack over the channel region; a source region in contact with the channel region at a junction, wherein the source region comprises a second semiconductor material having a X-valley transport energy band structure, wherein a <111> crystal direction of one or more crystals of the first and second semiconductor materials are substantially orthogonal to the junction; and a metal adjacent to the source region, the metal conductively coupled to the channel region through the junction.

In some embodiments, the substrate has cubic crystallinity and wherein the junction is substantially 45 degrees to a surface of the first region nearest a (100) plane of the substrate. In some embodiments, the substrate has cubic crystallinity and wherein the junction is substantially orthogonal to a surface of the first region nearest a (110) plane of the substrate. In some embodiments, the substrate has cubic crystallinity and wherein the junction is substantially parallel to a surface of the first region nearest a (111) plane of the substrate. In some embodiments, the junction comprises a facet of the first semiconductor material. In some embodiments, the first semiconductor material comprises germanium or indium gallium arsenide. In some embodiments, the second semiconductor material comprises silicon or silicon germanium. In some embodiments, the second semiconductor material comprises silicon germanium with a graded concentration of germanium, the graded concentration comprising a greater than 50% concentration of germanium adjacent the junction.

In another example, a system is provided comprising: a display subsystem; a wireless communication interface; and an integrated circuit device, the integrated circuit device comprising: a channel region over a substrate, wherein the channel region comprises a first semiconductor material having a L-valley transport energy band structure; a gate stack on the channel region; a source region in contact with the channel region at a junction, wherein the source region comprises a second semiconductor material having a X-valley transport energy band structure, wherein a <111> crystal direction of one or more crystals of the first and second semiconductor materials are substantially orthogonal to the junction; and a metal adjacent to the source region, the metal conductively coupled to the channel region through the junction.

In some embodiments, the substrate has cubic crystallinity and wherein the junction is substantially 45 degrees to a surface of the first region nearest a (100) plane of the substrate. In some embodiments, the substrate has cubic crystallinity and wherein the junction is substantially orthogonal to a surface of the first region nearest a (110) plane of the substrate. In some embodiments, the substrate has cubic crystallinity and wherein the junction is substantially parallel to a surface of the first region nearest a (111) plane of the substrate. In some embodiments, the junction comprises a facet of the first semiconductor material. In some embodiments, the first semiconductor material comprises germanium or indium gallium arsenide. In some embodiments, the second semiconductor material comprises silicon or silicon germanium. In some embodiments, the second semiconductor material comprises silicon germanium with a graded concentration of germanium, the graded concentration comprising a greater than 50% concentration of germanium adjacent the junction.

In another example, method of forming an NMOS device is provided comprising: receiving a substrate; epitaxially forming a first region over the substrate, wherein the first region comprises a first semiconductor material having a L-valley transport energy band structure; epitaxially forming a second region in contact with the first region at a junction, wherein the second region comprises a second semiconductor material having a X-valley transport energy band structure, wherein a <111> crystal direction of one or more crystals of the first and second semiconductor materials are substantially orthogonal to the junction; and forming a metal adjacent to the second region, the metal conductively coupled to the first region through the junction.

In some embodiments, receiving a substrate comprises receiving a (100) substrate, and wherein epitaxially forming a second region in contact with the first region at a junction comprises epitaxially forming the second region in contact with a (111) grown facet of the first region. In some embodiments, receiving a substrate comprises receiving a (100) substrate, and wherein epitaxially forming a second region in contact with the first region at a junction comprises epitaxially forming the second region in contact with a (111) etched facet of the first region. In some embodiments, receiving a substrate comprises receiving a (110) substrate, and wherein epitaxially forming a second region in contact with the first region at a junction comprises epitaxially forming the second region in contact with an undercut vertical sidewall of the first region. In some embodiments, receiving a substrate comprises receiving a (110) substrate, and wherein epitaxially forming a second region in contact with the first region at a junction comprises epitaxially forming the second region in contact with an outer vertical sidewall of a fin of the first region. In some embodiments, receiving a substrate comprises receiving a (111) substrate, and wherein epitaxially forming a second region in contact with the first region at a junction comprises epitaxially forming the second region in contact with an irregular etched surface of the first region. In some embodiments, epitaxially forming a first region over the substrate comprises epitaxially forming germanium or indium gallium arsenide. In some embodiments, epitaxially forming a second region in contact with the first region at a junction comprises epitaxially forming silicon or silicon germanium. In some embodiments, epitaxially forming a second region in contact with the first region at a junction comprises epitaxially forming silicon germanium with a graded concentration of germanium, the graded concentration comprising a greater than 50% concentration of germanium adjacent the junction An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:
1. An apparatus comprising:
a first region over a substrate, wherein the first region comprises a first semiconductor material having a L-valley transport energy band structure;

a second region in contact with the first region at a junction, wherein the second region comprises a second semiconductor material having a X-valley transport energy band structure, wherein a <111> crystal direction of one or more crystals of the first and second semiconductor materials are substantially orthogonal to the junction; and a metal adjacent to the second region, the metal conductively coupled to the first region through the junction, wherein the substrate has cubic crystallinity, and wherein the junction is one of (A) substantially orthogonal to a (110) plane of the substrate, or (B) substantially parallel to a (111) plane of the substrate.

2. The apparatus of claim 1, wherein the junction is substantially 45 degrees to a surface of the first region nearest a (100) plane of the substrate.

3. The apparatus of claim 1, wherein the junction is substantially orthogonal to a surface of the first region nearest a (110) plane of the substrate.

4. The apparatus of claim 1, wherein the junction is substantially parallel to a surface of the first region nearest a (111) plane of the substrate.

5. The apparatus of claim 1, wherein the first semiconductor material comprises germanium or indium, gallium, and arsenic, and wherein the junction comprises a facet of the first semiconductor material.

6. The apparatus of claim 1, wherein the second semiconductor material comprises at least one of silicon or germanium.

7. The apparatus of claim 1, wherein the second semiconductor material comprises silicon and germanium with a graded concentration of germanium, the graded concentration comprising a greater than 50% concentration of germanium adjacent the junction.

8. The apparatus of claim 1, wherein the second semiconductor material comprises silicon and germanium with a graded concentration of germanium.

9. A NMOS device comprising:
a channel region over a substrate, wherein the channel region comprises a first semiconductor material having a L-valley transport energy band structure;
a gate stack over the channel region;
a source region in contact with the channel region at a junction, wherein the source region comprises a second semiconductor material having a X-valley transport energy band structure, wherein a <111> crystal direction of one or more crystals of the first and second semiconductor materials are substantially orthogonal to the junction; and
a metal adjacent to the source region, the metal conductively coupled to the channel region through the junction,
wherein the second semiconductor material comprises silicon and germanium, and the germanium concentration is greater than 50% adjacent the junction.

10. The NMOS device of claim 9, wherein the substrate has cubic crystallinity and wherein the junction is substantially 45 degrees to a surface of the first region nearest a (100) plane of the substrate.

11. The NMOS device of claim 9, wherein the substrate has cubic crystallinity and wherein the junction is substantially orthogonal to a surface of the first region nearest a (110) plane of the substrate.

12. The NMOS device of claim 9, wherein the substrate has cubic crystallinity and wherein the junction is substantially parallel to a surface of the first region nearest a (111) plane of the substrate.

13. The NMOS device of claim 9, wherein the first semiconductor material comprises germanium or indium, gallium, and arsenic, and wherein the junction comprises a facet of the first semiconductor material.

14. The NMOS device of claim 9, wherein the concentration of germanium within the second semiconductor material is graded.

15. A system comprising:
a display subsystem;
a wireless communication interface; and
an integrated circuit device, the integrated circuit device comprising:
a channel region over a substrate, wherein the channel region comprises a first semiconductor material having a L-valley transport energy band structure;
a gate stack on the channel region;
a source region in contact with the channel region at a junction, wherein the source region comprises a second semiconductor material having a X-valley transport energy band structure, wherein a <111> crystal direction of one or more crystals of the first and second semiconductor materials are substantially orthogonal to the junction, wherein the second semiconductor material comprises silicon and germanium with a graded concentration of germanium; and
a metal adjacent to the source region, the metal conductively coupled to the channel region through the junction.

16. The system of claim 15, wherein the substrate has cubic crystallinity and wherein the junction is substantially 45 degrees to a surface of the first region nearest a (100) plane of the substrate.

17. The system of claim 15, wherein the substrate has cubic crystallinity and wherein the junction is substantially orthogonal to a surface of the first region nearest a (110) plane of the substrate.

18. The system of claim 15, wherein the substrate has cubic crystallinity and wherein the junction is substantially parallel to a surface of the first region nearest a (111) plane of the substrate, wherein the junction comprises a facet of the first semiconductor material.

* * * * *